(12) United States Patent
Pelley

(10) Patent No.: US 8,988,129 B2
(45) Date of Patent: Mar. 24, 2015

(54) LEVEL SHIFTER WITH STATIC PRECHARGE CIRCUIT

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/972,284

(22) Filed: Aug. 21, 2013

(65) Prior Publication Data

US 2015/0054562 A1 Feb. 26, 2015

(51) Int. Cl.
*H03L 5/00* (2006.01)
*H03K 19/0175* (2006.01)

(52) U.S. Cl.
CPC .................................. *H03K 19/0175* (2013.01)
USPC ................................ 327/333; 326/80; 326/81

(58) Field of Classification Search
CPC .............. H03K 19/017509; H03K 19/018507; H03K 19/018514; H03K 19/018521; H03K 19/018528
USPC ........................................ 327/333; 326/80, 81
See application file for complete search history.

(56) References Cited

U.S. PATENT DOCUMENTS

| | | | |
|---|---|---|---|
| 4,558,235 A | 12/1985 | White et al. | |
| 5,530,392 A * | 6/1996 | Runas et al. | 327/333 |
| 6,580,411 B1 * | 6/2003 | Kubota et al. | 345/98 |
| 7,129,752 B2 | 10/2006 | Bayer | |
| 7,468,615 B1 * | 12/2008 | Tan et al. | 326/68 |
| 7,777,523 B1 * | 8/2010 | Masleid et al. | 326/68 |
| 7,804,346 B2 * | 9/2010 | Park | 327/208 |
| 2003/0132779 A1 * | 7/2003 | Yoo et al. | 326/81 |
| 2004/0232944 A1 | 11/2004 | Bu et al. | |
| 2011/0006828 A1 * | 1/2011 | Chen et al. | 327/333 |
| 2012/0274382 A1 | 11/2012 | Ucciardello et al. | |

* cited by examiner

*Primary Examiner* — William Hernandez

(57) ABSTRACT

A level shifter includes a static precharge circuit. During a precharge phase, two nodes of the level shifter are precharged to a voltage at or near a reference voltage. During an evaluate phase, the level shifter maintains one of the nodes at the precharge voltage, while the other node is pulled to a different voltage level, such as at or near a ground voltage level, wherein the node that is maintained is selected based on the state of data input signals of the level shifter. The voltage at the nodes determines the state of the level shifter output signals, such that the output signals represent the input signals at a shifted voltage level. The level shifter can include a capacitor to feed forward a signal that causes the precharging to terminate more quickly.

18 Claims, 3 Drawing Sheets

LEVEL SHIFTER WITH STATIC PRECHARGE CIRCUIT

BACKGROUND

1. Field of the Disclosure

The present disclosure relates generally to integrated circuits, and more specifically to level shifters for integrated circuits.

2. Description of the Related Art

Level shifters are utilized in integrated circuits for changing the voltage of a signal from one voltage level to another voltage level. For example, some integrated circuits employ different power domains, wherein different reference voltages (sometimes referred to as VDD) are used to power the circuitry for each power domain. The reference voltage in a power domain defines the voltage levels that represent an asserted logic state (e.g. a logic value of "1") and a negated logic state (e.g. a logic value of "0") for signals in the power domain. In order to ensure proper communication of information between power domains, a level shifter can be employed to shift the voltage of a signal communicated across the power domains so that the logic state represented by the signal is consistent over the power domains. However, conventional level shifters can introduce an undesirable delay in the signal path of the signal communicated across the power domains.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
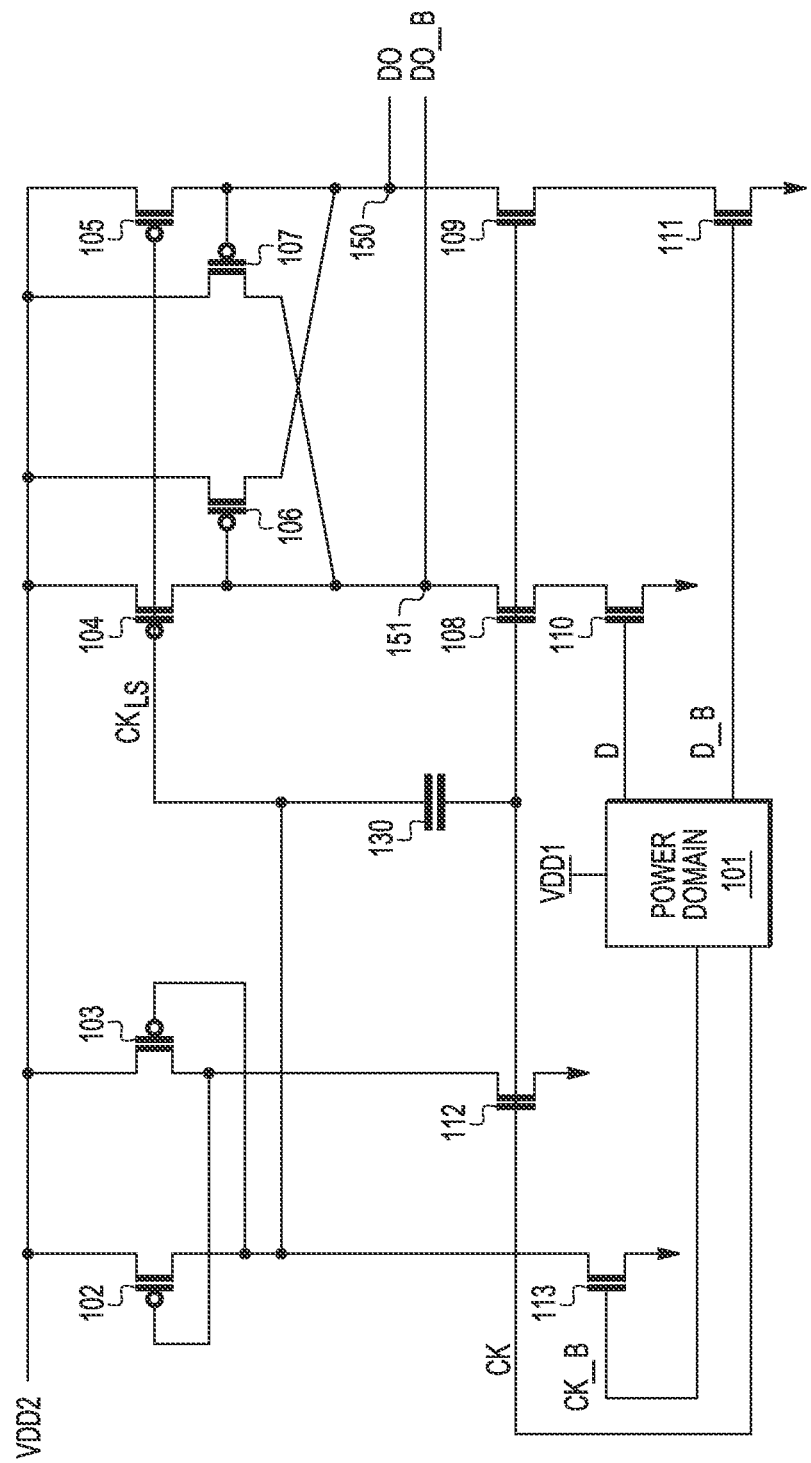
FIG. 1 is a circuit diagram of one embodiment of a level shifter according to the present disclosure.
Figure 2:
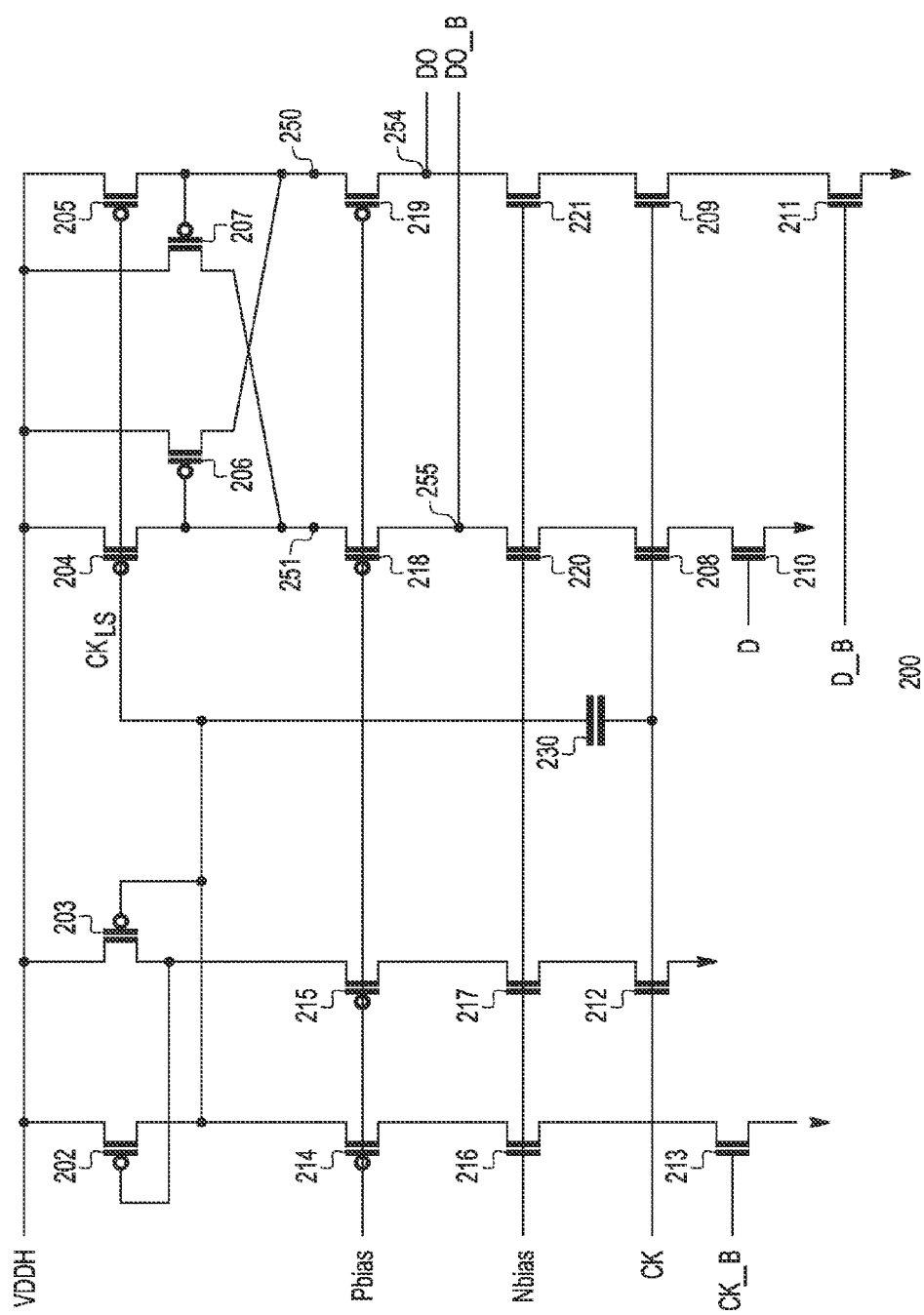
FIG. 2 is a circuit diagram of another embodiment of a level shifter according to the present disclosure.
Figure 3:
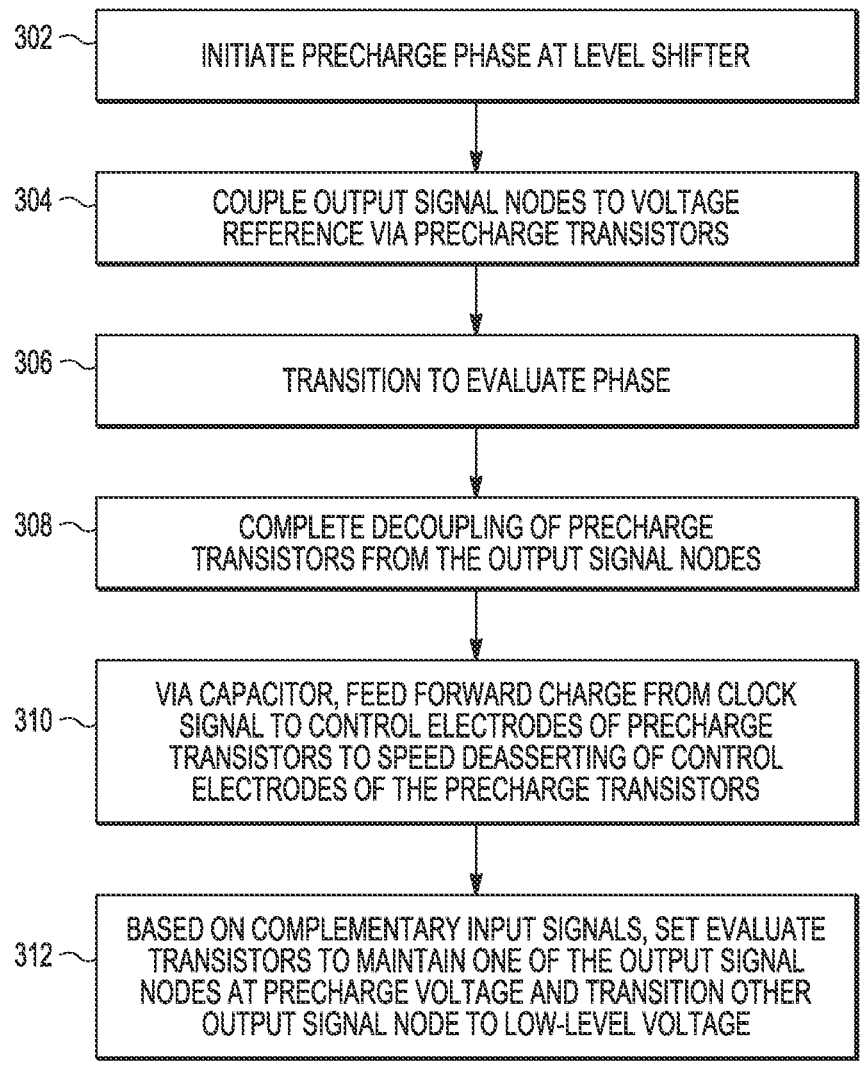
FIG. 3 is a flow diagram illustrating one embodiment of a method for shifting the voltage level of a signal at an integrated circuit according to the present disclosure.

FIGS. 1-3 disclose embodiments of a level shifter having a static precharge circuit that level shifts a received input signal in two periodic phases: a precharge phase and an evaluate phase. During the precharge phase, two nodes of the static precharge circuit are precharged to a voltage at or near a reference voltage. During the evaluate phase, the level shifter selects, based on the state of the input signal, one of the two precharged nodes and maintains the selected node at the precharge voltage. The other of the two precharged nodes while the other node is pulled to a different voltage level, such as a ground voltage level. The voltage at the nodes determines the state of the level shifter output signals, such that the output signals represent the input signals at a shifted voltage level. The precharging of the nodes at the level shifter allows the level shifter to quickly respond to dynamic changes in the data input signals. In at least one embodiment, the level shifter includes a capacitor to feed forward a signal that causes the precharging to terminate more quickly, further increasing the level shifter's responsiveness.

FIG. 1 illustrates a circuit diagram of one embodiment of a level shifter 100 according to the present disclosure. In the embodiment of FIG. 1, level shifter 100 is generally configured to shift an input signal received from a source domain 101 associated with a reference voltage, designated "VDD1" to an output signal provided to a receiver domain associated with a reference voltage, designated "VDD2". In at least one embodiment, the reference voltage VDD2 is specified to be the same, or substantially the same, voltage as the voltage reference VDD1. However, when signals are sent from the source domain to the receiver domain, the local voltage references VDD and GND at the signal source (the VDD1 domain) may vary slightly from the VDD and GND at the signal receiver (the VDD2 domain) due to voltage drops across the power busses.

In the illustrated example of FIG. 1, the level shifter 100 receives two complementary input signals, designated "D" and "D_B", both generated in the VDD1 domain. In addition, the level shifter 100 receives complementary clock signals, designated "CK" and "CK_B", also generated in the VDD1 domain 101. As described further below, the level shifter 100 employs the clock signals CK and CK_B to generate complementary output signals, designated "DO" and "DO_B", which are level-shifted representations of the D and D_B signals, respectively, for the VDD2 domain. The level shifter 100 thus causes the input signals D and D_B to be properly translated to signals in the receiver domain by accounting for variations in the local voltage references.

The level shifter 100 includes p-type transistors 102, 103, 104, 105, 106, and 107 (collectively, p-type transistors 102-107), n-type transistors 108, 109, 110, 111, and 112 (collectively, n-type transistor 108-112), and a capacitor 130. It will be appreciated that in other embodiments, the types of each the illustrated transistors can be reversed (so that transistors illustrated as p-type are n-type transistors and transistors illustrated as n-type are p-type transistors) and inverters employed to ensure proper polarity of signals provided to the control electrodes of each transistor.

The transistor 102 has a first current electrode connected to a voltage reference, designated "VDD2", a second current electrode, and a control electrode. The transistor 103 has a first current electrode connected to the VDD2 voltage reference, a second current electrode connected to the control electrode of the transistor 102, and a control electrode connected to the second current electrode of the transistor 102. The transistor 113 has a first current electrode connected to the second current electrode of the transistor 102, a second current electrode connected to a ground voltage reference, and a control electrode connected to receive the lock signal designated CK_B. The transistor 112 includes a first current electrode connected to the second current electrode of the transistor 103, a second current electrode connected to the ground voltage reference, and a control electrode connected to receive the clock signal CK.

The transistor 104 includes a first current electrode connected to the VDD2 voltage reference, a second current electrode connected to a node 151, and a control electrode connected to the first current electrode of the transistor 113. The transistor 108 includes a first current electrode connected to the node 151, a second current electrode, and a control electrode connected to receive the CK clock signal. The transistor 110 includes a first current electrode connected to the second current electrode of the transistor 108, a second current electrode connected to the ground voltage reference, and a control electrode connected to receive the input signal D. The transistor 105 includes a first current electrode connected to the VDD2 voltage reference, a second current electrode connected to a node 150, and a control electrode connected to the first current electrode of the transistor 113. The transistor 109 includes a first current electrode connected to the node 150, a second current electrode, and a control electrode connected to receive the CK clock signal. The transistor 111 includes a first current electrode connected to the second current electrode of the transistor 109, a second current electrode connected to the ground voltage reference, and a control electrode connected to receive the input signal designated D_B.

The transistor 106 includes a first current electrode connected to the VDD2 voltage reference, a second current electrode connected to the second current electrode of the transistor 105, and a control electrode connected to the second current electrode of the transistor 104. The transistor 107 includes a first current electrode connected to the VDD2 voltage reference, a second current electrode connected to the second current electrode of the transistor 104, and a control electrode connected to the second current electrode of the transistor 105. The capacitor 130 includes a first terminal connected to the first current electrode of the transistor 113 and a second terminal connected to receive the CK clock signal.

In operation, the nodes 150 and 151 provide a differential output signal represented by the complementary output signals DO and DO_B, that are level shifted representations of the differential input signal represented by input signals, D and D_B. In at least one embodiment, the level shifter 100 is incorporated into an integrated circuit device having a power domain connected to a reference voltage designated "VDD1" (not shown) and a power domain connected to the VDD2 voltage reference. An asserted logic state is represented in the VDD1 domain by a voltage at or near VDD1, while an asserted logic state is represented in the VDD2 power domain by a voltage at or near VDD2. A negated logic state is represented in both power domains by a voltage at or near the ground voltage reference. In at least one embodiment, VDD1 is substantially similar to VDD2. As used herein, a first voltage is substantially similar to a second voltage if the first voltage does not vary from the second voltage by more than 5%. In at least one embodiment, VDD2 is different from (e.g. varies by more than 5% from) VDD2.

The input signals D and D_B are generated at the VDD1 domain, and are communicated to the VDD2 domain via the level shifter 100, which shifts the level of the input signals D and D_B so that the logic state represented by each signal is preserved across the power domains. In particular, when the input signal D is at or near VDD1, therefore representing an asserted logic state, the output signal DO is generated to be at or near VDD2, therefore also representing an asserted logic state. When the input signal D is at or near the ground voltage level, therefore representing a negated logic state, the output signal DO is generated to be at or near the ground voltage level, therefore also representing a negated logic state.

The clock signals CK and CK_B are generated in the VDD1 domain to manage the level shifting of the level shifter 100. In particular, the level shifting is enacted over two periodic phases: a precharge phase, and an evaluate phase. Each of the precharge and data phases are controlled by the phases of the clock signals CK and CK_B. In the example of FIG. 1, the clock signals CK and CK_B are complementary signals, and a precharge phase occurs when the clock signal CK is in a negated state and the clock signal CK_B is an asserted state. An evaluate phase occurs when the clock signal CK is in an asserted state and the clock signal CK_B is in a negated state. The signal D and D_B are setup during the period when CK_B is active high (that is, during the precharge phase) so that there is no delay in the data path during the evaluate phase when CK is active high. Since the data signals D and D_B and the clock signals CK and CK_B are all generated in the VDD1 domain the setup time of changes in the states of the data signals D and D_B can be closely controlled, allowing for a smaller required setup time.

During the precharge phase, the transistor 113 is placed in a conductive state, thereby pulling the control electrodes for the transistors 104 and 105 to a relatively low voltage and placing these transistors in conductive states. In addition, because the clock signal CK is negated during the precharge phase, the transistors 108 and 109 are placed in non-conductive states. The combination of conductivity at the transistors 104 and 105 and non-conductivity at the transistors 108 and 109 causes the voltages at nodes 150 and 151 to be precharged to a level at or near VDD2, such that the signals DO and DO_B are both precharged to an asserted state relative to the high power domain.

During the evaluate phase, the state of the output signals DO and DO_B are determined by the state of the input signals D and D_B. To illustrate, during the evaluate phase, the transistor 112 is placed in a conductive state and the transistor 113 is placed in a non-conductive state, so that the voltage at the control electrodes for the transistors 104 and 105 are set to a relatively high level. This places the transistors 104 and 105 in non-conductive states and terminates the precharging of the nodes 150 and 151. The asserted state of the clock signal CK places the transistors 108 and 109 in conductive states, so that the state of the output signals DO and DO_B are determined by the conductivity of the transistors 110 and 111 as controlled by the signals D and D_B.

For example, if the signal D is in the asserted state (at or near VDD1), the transistor 110 is placed in a conductive state, thereby pulling the node 151 to near the ground voltage level and therefore placing the signal D_B in the negated state. In addition, the control electrode for the transistor 106 is pulled to near the ground voltage level, so that the transistor 106 is conductive. This conductivity maintains the voltage at the node 150 to be at or near the VDD2 voltage level to which it was precharged during the precharge phase, thus placing the signal DO in an asserted state. If the signal D is in the negated state, then the signal D_B is in the asserted state. Accordingly, transistor 111 is placed in a conductive state, thereby pulling the node 150 to near the ground voltage level and therefore placing the signal DO in the negated state. In addition, the control electrode for the transistor 107 is pulled to near the ground voltage level, so that the transistor 107 is conductive. This conductivity maintains the voltage at the node 151 to be at or near the VDD2 voltage level to which it was precharged during the precharge phase, thus placing the signal D_B in an asserted state. Thus, the data output signals DO and DO_B are level shifted representations of the input signals D and D_B.

Because one of the nodes 150 and 151 must transition, during each evaluate phase, from its precharged state at or near the voltage VDD2 to a voltage at or near the ground voltage level, there is a delay between the clock signals CK and CK_B initiating the evaluate phase and the "setup" point, when the output signals DO and DO_B accurately represent the input signals D and D_B. In at least one embodiment, the transistors of the level shifter 100 are sized relative to each other to reduce this delay. In particular, the transistors 104, 105, and 113 are sized to be relatively small, or "weak", transistors, and the transistors 108, 109, 110, 111, and 112 are sized to be relatively large or "strong" transistors. Transistor 112 is weak to allow transistor 102 to turn off the precharge devices 104 and 105 more quickly at the beginning of the evaluate phase. Because transistors 104 and 105 are weak, transistor 108 and 110 or transistors 109 and 111 can begin to discharge the nodes 151 or 150 respectively, depending on the state of D and D_B, even before transistors 104 and 105 are completely off. Because of this size difference, the transistors 108-111 more quickly establish the states of the nodes 150 and 151 during the evaluate phase, thereby reducing the delay between the start of the evaluate phase and the output data stable point. In at least one embodiment, a relatively large transistor (e.g. one of the transistors 108-111) is at least five times the size (as indicated by the channel width of each transistor) of a relatively small transistor (e.g. one of the transistors 104, 105, 112, and 113). In at least one embodiment, a relatively large transistor is at least ten times the size of a relatively small transistor.

The capacitor 130 also reduces the delay in turning off transistors 104 and 105 at the beginning of the evaluate phase. To illustrate, during the precharge phase the capacitor 130 is discharged to the ground voltage reference through the transistor 113. At his time the signal CK is approximately at the GND level. When the precharge phase switches to the evaluate phase, the state of the clock signal CK is such that both terminals of the capacitor high are coupled to at or near the VDD2 voltage level, causing the gate of transistor 104 and 105 to rise more quickly and thereby causing the transistors 104 and 105 to reach non-conductive states more quickly. The speed at which the precharging of the nodes 150 and 151 terminates is therefore increased. In at least one embodiment, capacitor 130 is an MIM (metal insulator metal) capacitor.

The transistors 102, 103, 112, and 113 function as a level shifter which assists in terminating precharging at the nodes 150 and 151. To illustrate, during the precharge phase, the transistor 103 is placed in a conductive state when transistor 113 turns on due to the signal CK_B going high, thus ensuring that the transistor 102 is maintained in a non-conductive state. During the evaluate phase the transistor 102 is placed in a conductive state when transistor 112 is turned on due to the signal CK going high, thus applying a relatively high voltage to the control electrodes of the transistors 104 and 105. This causes the transistors 104 and 105 to reach non-conductive states more quickly and increases the speed at which the precharging of the nodes 150 and 151 terminates. As previously described the transistors 102, 103, 112, and 113 are sized (weak and strong) such that the devices 104 and 105 turn off very quickly during the evaluate phase. This results in the transistors 104 and 105 turning on more slowly during the precharge phase. This is not an issue since the whole precharge phase is available to turn on transistor 104 and 105 and the precharge nodes 150 and 151 to approximately VDD2.

FIG. 2 illustrates a circuit diagram of one embodiment of a level shifter 200 according to the present disclosure. Level shifter 200 provides a level shifting function for signals communicated from a low-power domain associated with voltage references designated "VDDL" and "GND" to higher-power domain associated with voltage reference GND and a voltage reference designated "VDDH." In at least one embodiment, VDDH is a substantially higher voltage than VDDL. The function of level shifter 200 is similar to that of level shifter 100 but level shifter 200 includes additional transistors to prevent transistor breakdown due to the higher voltage VDDH.

The level shifter 200 includes p-type transistors 202-207, 214, 215, 218, and 219, n-type transistors 208, 212, 216, 217, 220, and 221, and a capacitor 230. The transistor 202 has a first current electrode connected to the voltage reference VDDH, a second current electrode, and a control electrode. The transistor 203 has a first current electrode connected to the VDDH voltage reference, a second current electrode connected to the control electrode of the transistor 202, and a control electrode connected to the second current electrode of the transistor 202. The transistor 214 has a first current electrode connected to the second current electrode of the transistor 202, a second current electrode, and a control electrode connected to receive a bias signal designated "Pbias". The transistor 216 has a first current electrode connected to the second current electrode of the transistor 214, a second current electrode, and a control electrode connected to receive a bias signal designated "Nbias". The transistor 213 has a first current electrode connected to the second current electrode of the transistor 216, a second current electrode connected to a ground voltage reference, and a control electrode connected to receive a clock signal designated "CK_B".

The transistor 215 has a first current electrode connected to the second current electrode of the transistor 203, a second current electrode, and a control electrode connected to receive the Pbias signal. The transistor 217 includes a first current electrode connected to the second current electrode of the transistor 215, a second current electrode, and a control electrode to receive the Nbias signal. The transistor 212 includes a first current electrode connected to the second current electrode of the transistor 217, a second current electrode connected to the ground voltage reference, and a control electrode connected to receive a clock signal labeled "CK".

The transistor 204 includes a first current electrode connected to the VDDH voltage reference, a second current electrode connected to a node 251, and a control electrode connected to the second current electrode of the transistor 202. The transistor 218 has a first current electrode connected to the node 251, a second current electrode connected to a node 255, and a control electrode connected to receive the Pbias signal. The transistor 220 includes a first current electrode connected to the node 255, a second current electrode, and a control electrode to receive the Nbias signal. An output signal designated "DO" is a voltage signal governed by the voltage at the node 255. The transistor 208 includes a first current electrode connected to the second current electrode of the transistor 220, a second current electrode, and a control electrode connected to receive the CK clock signal. The transistor 210 includes a first current electrode connected to the second current electrode of the transistor 208, a second current electrode connected to the ground voltage reference, and a control electrode connected to receive an input signal designated "D".

The transistor 205 includes a first current electrode connected to the VDDH voltage reference, a second current electrode connected to a node 250, and a control electrode connected to the second current electrode of the transistor 202. The transistor 219 has a first current electrode connected to the second current electrode of the transistor 205, a second current electrode connected to a node 254, and a control electrode connected to receive the signal Pbias. An output signal designated "DO_B" is a voltage signal governed by the voltage at the node 254. The transistor 221 includes a first current electrode connected to the node 254, a second current electrode, and a control electrode to receive the Nbias signal. The transistor 209 includes a first current electrode connected to the second current electrode of the transistor 221, a second current electrode, and a control electrode connected to receive the CK clock signal. The transistor 211 includes a first current electrode connected to the second current electrode of the transistor 209, a second current electrode connected to the ground voltage reference, and a control electrode connected to receive an input signal designated "D_B" (the complement of the signal D).

The transistor 206 includes a first current electrode connected to the VDDH voltage reference, a second current electrode connected to the second current electrode of the transistor 205, and a control electrode connected to the second current electrode of the transistor 204. The transistor 207 includes a first current electrode connected to the VDDH voltage reference, a second current electrode connected to the second current electrode of the transistor 204, and a control electrode connected to the second current electrode of the transistor 205. The capacitor 210 includes a first terminal connected to the first current electrode of the transistor 213 and a second terminal connected to receive the CK clock signal. In some embodiments, the capacitor 230 is a MIM capacitor or an NFET capacitor.

During operation, the bias signals Pbias and Nbias are set so that the voltage drop across the transistor pairs 214 and 216, 215 and 217, 218 and 220, and 219 and 221, is approximately half of VDDH. This reduces the voltage across the transistors of level shifter 200 avoiding breakdown of the transistors. The other transistors of the level shifter 200 are configured to operate similarly to the corresponding transistors of FIG. 1. Accordingly, the level shifter 200 undergoes a series of alternating precharge and evaluate phases, as controlled by the clock signals CK and CK_B. During the precharge phase, the nodes 254 and 255 are precharged to a voltage at or near VDDH. During the evaluate phase, the nodes 250 and 251 are set so that the signals DO and DO_B are level shifted representations of the input signals D and D_B, respectively. The voltage across capacitor 230 is approximately VDDH minus VDDL. In other embodiments the signals DO and DO_B may be governed by the voltages at nodes 250 and 251 resulting in a voltage domain shift so that DO and DO_B switch between VDDH and Pbias plus a PFET threshold voltage (Vt) with otherwise identical functionality.

FIG. 3 is a flow diagram of one embodiment of a method 300 of level shifting a pair of complementary input signals. For purposes of description, the method 300 will be described with respect to an example implementation at the level shifter 100 of FIG. 1. At block 302, a precharge phase is initiated at the level shifter 100 by setting the clock signal CK to a negated state and the clock signal CK_B to an asserted state. At block 304, during the precharge phase the pair of transistors 104 and 105 (referred to in FIG. 3 as "precharge transistors") precharge the nodes 150 and 151 to a voltage at or near VDDH. At block 306 the precharge phase transitions to an evaluate phase by setting the clock signal CK to an asserted state and the clock signal CK_B to a negated state. In response, at block 308 the capacitor 130 feeds forward charge from the asserted CK clock signal to the control nodes of the transistors 104 and 105 to speed the deassertion of the control nodes. As a result, at block 310 deassertion of the controls nodes the decoupling of the precharge devices from the output nodes is completed. At block 312 the transistors 108-111 (referred to in FIG. 3 as the evaluate transistors) are configured so that one of the nodes 150 and 151 is maintained at its precharge state, while the other node is transitioned from its precharge state to a low-level voltage state, based on the states of the complementary input signals D and D_B. The voltage at the nodes 150 and 151 generate the output signals DO and DO_B, so that the signals are level-shifted representations of the input signals D and D_B.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A level shifter comprising:
a first transistor comprising a first current electrode coupled to a first voltage reference, a second current electrode coupled to a first output signal node, and a control electrode to receive a control signal responsive to a first clock signal;
a second transistor comprising a first current electrode coupled to the first output signal node, a second current electrode, and a control electrode responsive to a second clock signal;
a third transistor comprising a first current electrode coupled to the second current electrode of the second transistor, a second current electrode coupled to a second voltage reference, and a control electrode to receive a first data input signal; and
wherein the level shifter is configured to precharge the first output signal node to a first voltage during a precharge phase and to selectively, based on a state of the first data input signal, perform one of: maintaining the first output signal node at the first voltage during an evaluate phase and transitioning the first output signal node to a second voltage during the evaluate phase.

2. The level shifter of claim 1, further comprising:
a fourth transistor comprising a first current electrode coupled to the first voltage reference, a second current electrode coupled to a second output signal node, and a control electrode responsive to the control signal based on the first clock signal;
a fifth transistor comprising a first current electrode coupled to the second output signal node, a second current electrode, and a control electrode responsive to the second clock signal;
a sixth transistor comprising a first current electrode coupled to the second current electrode of the fifth transistor, a second current electrode coupled to the second voltage reference, and a control electrode responsive to a second data input signal that is a complement of the first data input signal; and
wherein the level shifter is to selectively, based on states of the first data input signal and the second data input signal, perform one of: maintaining the second output signal node at the first voltage during an evaluate phase and transitioning the second output signal node to a second voltage during the evaluate phase.

3. The level shifter of claim 2, further comprising:
a seventh transistor comprising a first current electrode to provide the control signal, a second current electrode coupled to the second voltage reference, and a control electrode to receive the first clock signal.

4. The level shifter of claim 3, wherein a size of the second transistor is at least 5 times as large as a size of the seventh transistor.

5. The level shifter of claim 4, wherein the size of the second transistor is approximately 10 times as large as the size of the seventh transistor.

6. The level shifter of claim 3, further comprising a capacitor comprising a first terminal coupled to the control electrode of the first transistor and a second terminal coupled to receive the second clock signal.

7. The level shifter of claim 6, wherein the first terminal of the capacitor is coupled to the control electrode of the fourth transistor.

8. The level shifter of claim 3, further comprising:
an eighth transistor comprising a first current electrode coupled to the first voltage reference, a second current electrode coupled to the first current electrode of the seventh transistor, and a control electrode; and
a ninth transistor comprising a first current electrode coupled to the first voltage reference, a second current electrode coupled to the control electrode of the eighth transistor, and a control electrode coupled to the second current electrode of the eighth transistor.

9. The level shifter of claim 8, further comprising:
a tenth transistor comprising a first current electrode coupled to the second current electrode of the ninth transistor, a second current electrode coupled to the second voltage reference, and a control electrode to receive the second clock signal.

10. The level shifter of claim 1, further comprising a capacitor comprising a first terminal coupled to the control electrode of the first transistor and a second terminal coupled to receive the second clock signal.

11. The level shifter of claim 1, wherein the first data input signal is to be received from a domain having a third voltage reference substantially similar to the first voltage reference.

12. The level shifter of claim 1, wherein the first data input signal is to be received from a domain having a third voltage reference different than the first voltage reference.

13. A level shifter, comprising:
a first transistor comprising a first current electrode coupled to a first voltage reference, a second current electrode coupled to a first output signal node, and a control electrode to receive a control signal based on a first clock signal
a second transistor comprising a first current electrode coupled to the first output signal node, a second current electrode, and a control electrode to receive a second clock signal;
a third transistor comprising a first current electrode coupled to the second current electrode of the second transistor, a second current electrode coupled to a second voltage reference, and a control electrode to receive a first data input signal;
a capacitor comprising a first terminal coupled to the control electrode of the first transistor and a second terminal coupled to the control electrode of the second transistor; and
wherein the first output signal node is to be precharged to a first voltage during a precharge phase and is to be selectively maintained at the first voltage or transitioned to a second voltage during an evaluate phase based on a state of the data input signal.

14. The level shifter of claim 13, further comprising:
a fourth transistor comprising a first current electrode coupled to the first voltage reference, a second current electrode coupled to a second output signal node, and a control electrode to receive the control signal based on the first clock signal;
a fifth transistor comprising a first current electrode coupled to the second output signal node, a second current electrode, and a control electrode to receive the second clock signal;
a sixth transistor comprising a first current electrode coupled to the second current electrode of the fifth transistor, a second current electrode coupled to the second voltage reference, and a control electrode to receive a second data input signal; and
wherein the second output signal node is to be precharged to the first voltage during the precharge phase and is to be selectively maintained at the first voltage or transitioned to the second voltage during the evaluate phase based on states of the first and second data input signals.

15. The level shifter of claim 14, further comprising:
a seventh transistor comprising a first current electrode to provide the control signal, a second current electrode coupled to the second voltage reference, and a control electrode to receive the first clock signal.

16. The level shifter of claim 13, wherein the first data input signal is to be received from a domain having a third voltage reference substantially similar to the first voltage reference.

17. The level shifter of claim 13, wherein the first data input signal is to be received from a domain having a third voltage reference different than the first voltage reference.

18. A method of level shifting a signal from a first voltage domain to a second voltage domain, comprising:
during a precharge phase, precharging a first output signal node and a second output signal node of a level shifter to a first voltage of the second voltage domain via a pair of precharge transistors;
during an evaluate phase, setting conductivity of a set of evaluate transistors of the level shifter to selectively maintain one of the first and second output signal nodes at the first voltage and transitioning the other of the first and second output signal nodes from the first voltage to a second voltage, the configuration of the set of evaluate transistors based on a first input signal and second input signal of the first voltage domain; and
during the evaluate phase, transferring charge from a clock signal to control electrodes of the pair of precharge transistors via a capacitor.

* * * * *